(12) United States Patent
Okabe

(10) Patent No.: US 7,516,434 B2
(45) Date of Patent: Apr. 7, 2009

(54) LAYOUT DESIGN PROGRAM, LAYOUT DESIGN DEVICE AND LAYOUT DESIGN METHOD FOR SEMICONDUCTOR INTEGRATED CIRCUIT

(75) Inventor: Hideyuki Okabe, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 298 days.

(21) Appl. No.: 11/435,759

(22) Filed: May 18, 2006

(65) Prior Publication Data

US 2006/0265678 A1      Nov. 23, 2006

(30) Foreign Application Priority Data

May 19, 2005      (JP)     ............... 2005-146548

(51) Int. Cl.
  *G06F 17/50* (2006.01)
(52) U.S. Cl. .............................. 716/8; 716/1
(58) Field of Classification Search ...... 716/8, 716/1
  See application file for complete search history.

(56) References Cited

U.S. PATENT DOCUMENTS

| | | | | |
|---|---|---|---|---|
| 5,910,899 | A * | 6/1999 | Barrientos | 716/8 |
| 6,240,541 | B1 * | 5/2001 | Yasuda et al. | 716/6 |
| 7,228,514 | B2 * | 6/2007 | Chan et al. | 716/5 |
| 2005/0034091 | A1 * | 2/2005 | Harn | 716/6 |
| 2005/0076319 | A1 * | 4/2005 | Chow et al. | 716/10 |
| 2005/0081173 | A1 * | 4/2005 | Peyran | 716/9 |
| 2006/0190900 | A1 * | 8/2006 | Chan et al. | 716/13 |

FOREIGN PATENT DOCUMENTS

| | | |
|---|---|---|
| JP | 2002-366598 | 12/2002 |
| JP | 2003-330986 | 11/2003 |

* cited by examiner

*Primary Examiner*—Paul Dinh
*Assistant Examiner*—Suchin Parihar
(74) *Attorney, Agent, or Firm*—Foley & Lardner LLP

(57) ABSTRACT

A computer program product for floorplanning design of a semiconductor integrated circuit, embodied on a computer-readable medium and including code that, when executed, causes a computer to perform the following steps (a) to (d). The step (a) is the step of placing circuit blocks based on a netlist. The step (b) is the step of estimating an interconnection length between two of the placed circuit blocks based on the netlist and positions of the placed circuit blocks. The step (c) is the step of judging whether the estimated interconnection length satisfies timing constraints for connections among the circuit blocks, based on relation data indicating relations among interconnection lengths and timings. The step (d) is the step of outputting the judgment result.

21 Claims, 11 Drawing Sheets

Fig. 6

| OPERATIONAL FREQUENCY (31) | ALLOWABLE INTERCONNECTION LENGTH (32) |
|---|---|
| ⋮ | ⋮ |
| 300MHz | 12mm |
| ⋮ | ⋮ |
| 500MHz | 4mm |
| ⋮ | ⋮ |

Fig. 7

| INTERCONNECTION BETWEEN CIRCUIT BLOCKS (34) | CONSTRAINTS (35) |
|---|---|
| ⋮ | ⋮ |
| INTERCONNECTION 1 BETWEEN CIRCUIT BLOCKS A AND C | OPERATIONAL FREQUENCY: 300MHz |
| INTERCONNECTION 2 BETWEEN CIRCUIT BLOCKS A AND C | OPERATIONAL FREQUENCY: 500MHz |
| INTERCONNECTION BETWEEN CIRCUIT BLOCKS B AND C | OPERATIONAL FREQUENCY: 300MHz |
| ⋮ | ⋮ |

Fig. 15

| SETTING CONDITION | | | | DELAY TIME |
|---|---|---|---|---|
| MANUFACTURING PROCESS | TEMPERATURE | VOLTAGE | · · · | |
| | | | | ⋮ |
| | | | | 0.0003ns/μm |
| | | | | ⋮ |

LAYOUT DESIGN PROGRAM, LAYOUT DESIGN DEVICE AND LAYOUT DESIGN METHOD FOR SEMICONDUCTOR INTEGRATED CIRCUIT

BACKGROUND OF THE INVENTION

1. Field of the Invention

The present invention relates to a layout design program, a layout design device and a layout design method for a semiconductor integrated circuit. More particularly, a layout design program, a layout design device and a layout design method for a semiconductor integrated circuit including a plurality of circuit blocks.

2. Description of the Related Art

As is called an age of system-on-silicone (system-on-chip) wherein all the systems have been installed in one semiconductor integrated circuit (one chip) in recent years, semiconductor integrated circuits have been getting larger in its integration density. There is a demand to realize a highly integrated LSI operating at a high frequency, which is increasing a difficulty in terms of a design. In the process of designing a large-scale semiconductor integrated circuit, a critical factor is to obtain an optimal floorplanning in a floorplanning stage before processing placement and routing in order to realize an operation at a high operational frequency and a highly integrated layout.

In the layout of a semiconductor integrated circuit including a plurality of circuit blocks, a floorplanning design is carried out in a manner such that routing congestion is taken into account in the floorplanning stage on the basis of the number of interconnections among circuit blocks. In the above floorplanning design, it is impossible to take into account a timing constraints among the circuit blocks during designing the floorplanning. As a result, a timing violation is found out after implementing the placement and routing, causing numerous repetitions of returning to the floorplanning design. Hence, an enormous design TAT (Turn Around Time) is required.

A conventional floorplanning design tool has a function to take into account the routing congestion on the basis of the number of the interconnections among the circuit blocks in designing the floorplanning for a plurality of the circuit blocks in order to realize a floorplanning with little routing congestion problem. However, the floorplanning design function is not perfectly realized yet in designing the floorplanning for a plurality of the circuit blocks in terms of confirming the timing constraints among the circuit blocks and doing placement of the circuit blocks in a position to prevent the violations of the timing constraints. The conventional floorplanning design tool has a supplemental technique described below to do placement the circuit blocks without having the violations of the timing constraints.

Japanese Laid-Open Patent Application JP-P2002-366598A discloses a technique to enable the reduction of the floorplanning preparation time by prioritizing circuit blocks to be placed close to each other. This floorplanning preparation method for the semiconductor chip includes a process of performing static timing analysis and a process of prioritizing the circuit blocks to be placed close to each other. In the process of performing the static timing analysis, the static timing analysis is carried out by setting ranges in delay values among the circuit blocks calculated based on a tentative interconnect capacitance. In the process of prioritizing the circuit blocks to be placed close to each other, these circuit blocks are prioritized by using results of the static timing analysis. Moreover, in the process of prioritizing the circuit blocks to be placed close to each other, these circuit blocks may be prioritized based on the results of the static timing analysis and the portion of the number of the interconnections among the circuit blocks. Further, in the process of prioritizing the circuit blocks to be placed close to each other, these circuit blocks may be prioritized based on the weighted values for the results of the static timing analysis and the portion of the number of the interconnections among the circuit blocks. Furthermore, in the process of prioritizing the circuit blocks to be placed close to each other, these circuit blocks may be prioritized based on both the weighted values for the results of the static timing analysis and the portion of the number of the interconnections among the circuit blocks.

FIG. 1 is the flowchart showing a floorplanning preparation method in the semiconductor chip. In a step S81, delay values among the circuit blocks under the worst condition of a manufacturing process, temperature and voltage are calculated based on the tentative interconnect capacitance among the circuit blocks on the basis of a netlist. In a step S82, the calculated delay value among the circuit blocks is multiplied by each of coefficients for a close distance, a remote distance and an average distance among the circuit blocks. These coefficients are prepared in advance. The delay values are thus calculated in the cases of the circuit blocks placed closely (under), remotely (over) and in the average distance (center). In a step S83, the static timing analysis is carried out on the basis of the three kinds of the delay values among the circuit blocks. Based on the result of the static timing analysis, a path violating the timing constraints among certain circuit blocks is identified. In the following step S84, the order of placing the circuit blocks, which violate the timing constraints, is calculated on the basis of a certain equation. Once the order of the placement is calculated, the priority of the circuit blocks to be placed close to each other is determined, which is outputted as floorplanning information. Then, the floorplanning design is performed based on the floorplanning information in a step S85.

As described above, this technique is intended to prioritize the order of placing the circuit blocks for reducing the floorplanning preparation time. However, the TAT of the floorplanning preparation is increased and the floorplanning may not be optimized.

(1) The above-described technique is capable of obtaining the information on the priority of the circuit blocks to be placed close to each. However, since the information does not include distances among the circuit blocks which are concrete data to make a decision how far these circuit blocks are placed away from each other when these circuit blocks are actually placed on the chip in the floorplanning design, it is impossible to obtain an allowable range among the circuit blocks. Therefore, when there are a number of circuit blocks to be placed on the chip, even if the circuit blocks are placed in accordance with the priority order of the circuit blocks to be placed close to each, it may be required to set a great distance among the circuit blocks due to the large number of the circuit blocks. In this case, there is no information on the range of the distance among the circuit blocks in which the timing constraints is satisfied. As a result, the floorplanning is prepared without satisfying the timing constraints and the TAT of the floorplanning preparation may be increased.

(2) In an actual layout, an interconnect detour due to a routing congestion causes deterioration of routing convergence (routing closure). In the above-described technique, preparation of information is limited to the circuit blocks to be placed close to each other. As a result, the routing congestion is not considered and optimization of the floorplanning in consideration with the routing congestion may not be realized.

Japanese Laid-Open Patent Application JP-P2003-330986A also discloses a design method of the semiconductor integrated circuit to solve problems of a placement and routing congestion or a violation of a timing constraints without increasing the chip area and causing retrogressive operations such as repetitive floorplanning or RTL corrections. This design method of the semiconductor integrated circuit is a design method to design a layout of the semiconductor integrated circuit including a plurality of blocks configured with a functional micro such as a logic cell and a memory, and having interconnections to connect these blocks. The design method for a layout design includes a step of confirming the state of congestion, a step of confirming a violation of timing constraints and a step of changing the shape of the blocks. In the step of confirming the state of congestion, the states of the placement congestion and the routing congestion inside/outside the blocks are confirmed. In the step of confirming the violation of the timing constraints, the violations of the timing constraints inside/outside the blocks are confirmed. In the step of changing the shape of the blocks, the shapes of the blocks are changed in accordance with the congestion states of the placement and the routing and the violation of the timing constraints. The design method for the layout design further has steps of re-placement and re-routing to mitigate the violation of the timing constraints. In the step of the re-placement and re-routing, the re-placement and re-routing are implemented to mitigate the violation of the timing constraints with respect to the placement change of the logic cell and the functional micro inside the blocks and the routing change inside/outside the blocks that are caused by the change of the shapes of the blocks. The design method for the layout design also has steps of re-placement and re-routing to mitigate the placement and routing congestion. In these steps of the re-placement and re-routing, the re-placement and re-routing are implemented to mitigate the placement and routing congestion with respect to the placement change of the logic cell and the functional cell inside the blocks caused by the change of the shape of the blocks.

FIG. 2 is a flowchart showing the above-described design method of the semiconductor integrated circuit. First of all, the placement and routing result, the timing constraints and library are supplied (step S91). Then, the step of changing the shape of the blocks is carried out (step S93). Finally, the result is outputted (step S98). The change of the shape of the blocks in the step S93 is carried out in the following procedures.

The state of the placement and the routing congestion inside/outside the blocks, and the violation of the timing constraints are confirmed first (step S94). Then, the shape of the blocks are determined in order to solve the problem of the routing congestion and violation of the timing constraints which were confirmed in the foregoing step (step S95). Specifically, the block shapes are determined for change in the following three principles. First one is to change the block shape for expanding the area in which the interconnections are congested. Second one is to expand the shape of the block in which the violation of a set-up timing constraints is observed so that the distance among the blocks are shortened. Third one is to reduce the shape of the blocks in which the violation of a hold timing constraints is observed so that the distance among the blocks are expanded. The changes of the block shapes are thus determined (step S96). Thereafter, the placement and the routing are changed with respect to the area in which the shape of the block was changed (step S97).

The block shapes are thus changed, and the output result of the placement and routing in which the placement and the routing have been changed is provided in the step S98. In this technique, however, cases are expected as follows wherein the routing congestion and the violation of the timing constraints are not corrected, and causing another routing congestion and another violation of the timing constraints.

(1) This technique is intended to solve the placement and routing congestion and the violation of the timing constraints by changing the block shapes based on the result of the placement and routing. However, the floorplanning design must be implemented before obtaining the result of the placement and routing in practice. In this stage of the floorplanning, the result of the placement and routing does not exist. Therefore, the above method can not be applied to prepare a floorplanning in consideration with the placement and routing congestion and the timing constraints. Therefore, without optimizing the floorplanning subjected to the placement and routing, there will be a case in which the change of the block shapes on the basis of the placement and routing result does not make a correction of the routing congestion and violation of the timing constraints.

(2) When a portion having the routing congestion and a portion having the violation of the timing constraints are concentrated or overlapped, the above technique is intended to solve these problems by changing the shape of the relevant blocks. In other words, since the only blocks having these problems are exclusively considered, another routing congestion or another violation of the timing constraints among another surrounding blocks or in another surrounding areas may occur after this technique is carried out.

(3) Moreover, when the violation of the set-up timing constraints and the violation of the hold timing constraints are observed at the same time, the floorplanning may not be achieved convergence by simply expanding or reducing the block shape. The change of the block shape for correcting the set-up timing violation reduces the distance among the blocks, which may cause the hold timing violation. On the contrary, the change of the block shape for correcting the hold timing violation expands the distance among the blocks, which may cause the set-up timing violation. Therefore, it may be impossible to prepare a floorplanning to achieve the simultaneous convergence of the violations in both the set-up timing constraints and the hold timing constraints.

As described above, these techniques can not take into account both the routing congestion and the timing constraints at the same time in designing the floorplanning of the semiconductor devices. Consequently, the convergence of both the routing congestion and the violation of the timing constraints may not be achieved, which will result in repetitive processing from the floorplanning design to the placement and routing design.

As described above, the conventional floorplanning process employs a method for placing the circuit blocks on a chip and determining the shape of the circuit blocks on the basis of the connection relation strength among the circuit blocks. Accordingly, the routing congestion among the circuit blocks can be considered on the basis of the connecting relation strength among the circuit blocks. However, it is not known until practically implementing the placement and routing to find out whether the placement of the circuit blocks was determined to satisfy a timing constraints to be demanded in the final stage. Therefore, in order to obtain a floorplanning without having a routing congestion and satisfying timing constraints, repetitive processes from designing the floorplanning to the designing of routing are required. As a result, an enormous design TAT is necessary.

SUMMARY OF THE INVENTION

In order to achieve an aspect of the present invention, the present invention provides a computer program product for floorplanning design of a semiconductor integrated circuit, embodied on a computer-readable medium and including code that, when executed, causes a computer to perform the following: (a) placing a plurality of circuit blocks based on a netlist; (b) estimating an interconnection length between two of the placed plurality of circuit blocks based on the netlist and positions of the placed plurality of circuit blocks; (c) judging whether or not the estimated interconnection length satisfies timing constraints for connections among the plurality of circuit blocks, based on relation data indicating relations among interconnection lengths and timings; and (d) outputting the judgment result.

In addition to the floorplanning in consideration with the routing congestion on the basis of the number of the interconnections among the circuit blocks, the present invention enables in every block placement to judge whether a desired timing constraints is satisfied in the position in which the circuit block is placed, and the optimization of the floorplanning preparation to cope with the routing congestion and the timing constraints can be achieved. Accordingly, it is possible to eliminate the repetitive processes implemented by returning to the floorplanning to solve the routing congestion and the violation of the timing constraints.

BRIEF DESCRIPTION OF THE DRAWINGS

The above and other objects, advantages and features of the present invention will be more apparent from the following description taken in conjunction with the accompanying drawings, in which:

FIG. 6 is a diagram showing a configuration of an allowable interconnection length table according to the first embodiment of the present invention;

FIG. 7 is a diagram showing a configuration of a timing constraints table according to the first embodiment of the present invention;

FIG. 15 is a diagram showing a configuration of a delay value table according to the second embodiment of the present invention.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of a layout design program, a layout design device and a design method for a semiconductor integrated circuit according to the present invention will be described below with reference to the attached drawings.

First Embodiment

Figure 1:
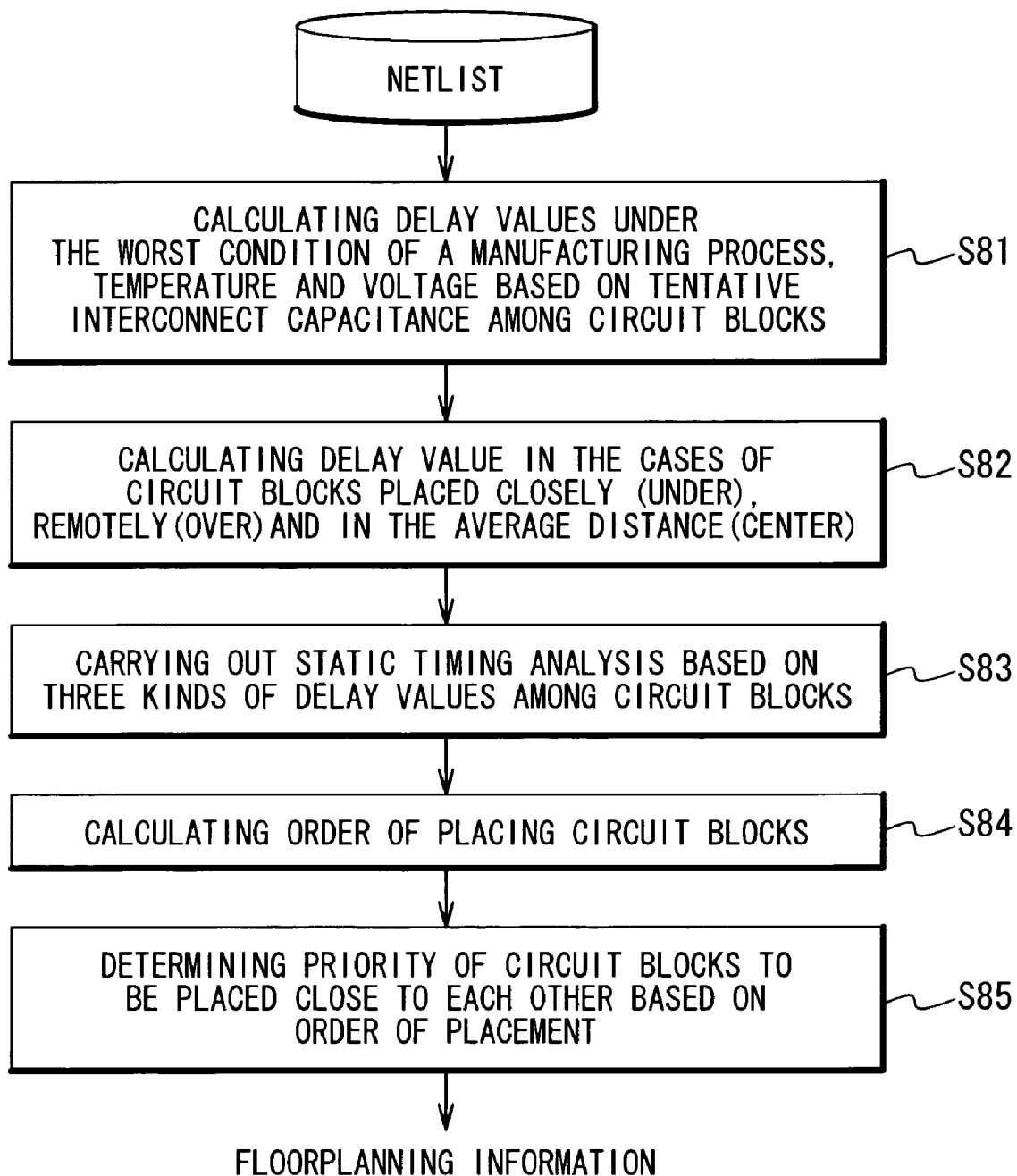
FIG. 1 is the flowchart showing a procedure of a conventional layout design process.
Figure 2:
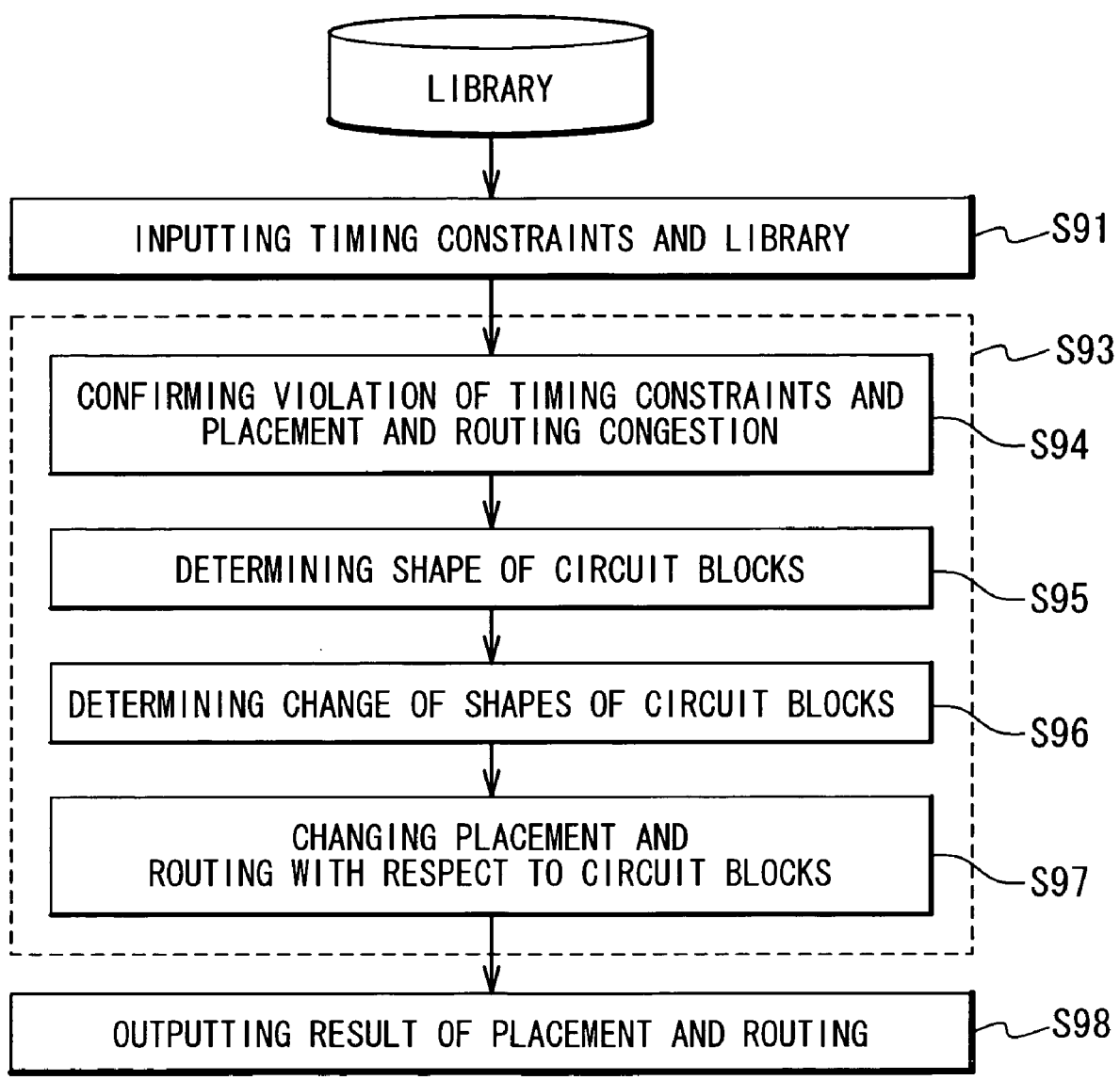
FIG. 2 is a flowchart showing a procedure of a conventional layout design process.
Figure 3:
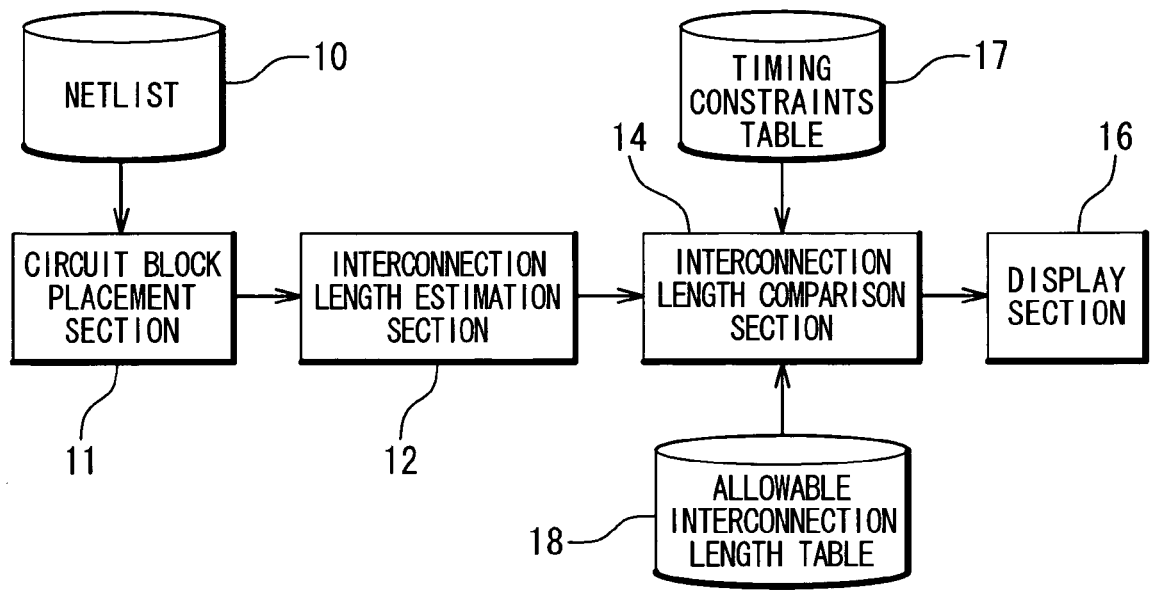
FIG. 3 is a diagram showing a configuration of a layout design device according to the first embodiment of the present invention.

Firstly, a layout design device according to the first embodiment of the present invention will be described below. FIG. 3 is a diagram showing a configuration of a layout design device for designing a semiconductor integrated circuit according to the first embodiment of the present invention. The layout design device 1 includes a circuit block placement section 11, an interconnection length estimation section 12, an interconnection length comparison section 14 and a display section 16. The layout design device 1 also includes a netlist 10, a timing constraints table 17 and an allowable interconnection length table 18, which are data provided for the processes thereof. Specifically, in the layout design, when the netlist 10, the timing constraints table 17 and the allowable interconnection length table 18 are supplied or set into the layout design device 1. Then, the circuit block placement section 11, the interconnection length estimation section 12, the interconnection length comparison section 14 and the display section 16 execute their processes, respectively, in the layout design device 1.

The circuit block placement section 11 places circuit blocks in consideration with the routing congestion based on data included in the netlist 10. Then, the circuit block placement section 11 outputs data indicating a layout in which the circuit blocks are placed to the interconnection length estimation section 12. The interconnection length estimation section 12 calculates tentative interconnection lengths among the circuit blocks placed in the circuit block placement section 11. Then, the interconnection length estimation section 12 outputs the calculated lengths as estimated interconnection lengths among the circuit blocks to the interconnection length comparison section 14. The interconnection length comparison section 14 calculates allowable interconnection lengths among the circuit blocks on the basis of the routing constraints among the circuit blocks included in the timing constraints table 17 and a allowable interconnection length in each operation frequency included in the allowable interconnection length table 18. The interconnection length comparison section 14 compares the allowable interconnection lengths to the estimated interconnection lengths estimated in the interconnection length estimation section 12. The interconnection length comparison section 14 outputs the comparison result to the display section 16. The display section 16 displays the comparison result compared in the interconnection length comparison section 14 on a display device.

The netlist 10 is data indicating connection relations among circuits, sizes and fixed numbers of circuits, which is well-know to those skilled in the art. Specifically, the netlist 10 indicates a configuration of a semiconductor integrated circuit and objects of a layout. The timing constraints table 17 includes data of operational frequencies in the semiconductor integrated circuit, instructing a timing to be satisfied by interconnections among the circuit blocks. The timing constraints table 17 lists up constraints 35 corresponding to an interconnection 34 among the circuit blocks as shown in FIG. 7. The operational frequencies are shown here as the constraints 35. The allowable interconnection length table 18 lists up an allowable interconnection length 32, which are the longest interconnection length to be allowable in a corresponding operational frequency 31 in the circuit as shown in FIG. 6. In the allowable interconnection length table 18, an allowable interconnection length 32 with respect to each operational frequency 31 is prepared in advance in consideration with a manufacturing process, temperature and voltage of the semiconductor integrated circuit. The allowable interconnection lengths 32 are determined in consideration with a buffer inserted in the interconnections to reduce an interconnection delay.

Figure 4:
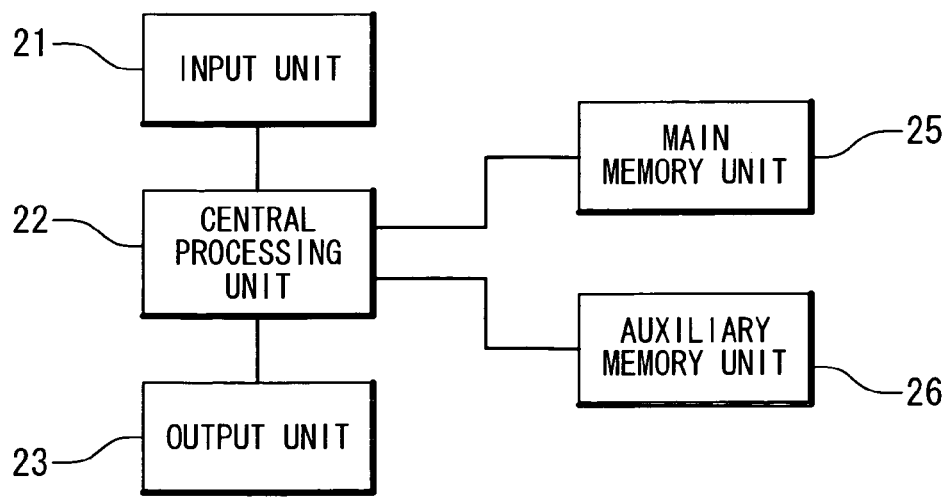
FIG. 4 is a diagram showing a hardware configuration of the layout design device according to the first embodiment of the present invention.

FIG. 4 is a diagram showing a hardware configuration of the layout design device of the semiconductor integrated circuit according to the first embodiment of the present invention. The layout design device is an information-processing device exemplified by a personal computer or a workstation, and a layout design program executed in the layout design device carries out a layout design. As shown in FIG. 4, the layout design device includes an input unit 21, a central processing unit (CPU) 22, an output unit 23, a main memory unit 25 and an auxiliary memory unit 26.

The input unit 21 is a keyboard, a mouse and a file input unit or the like, and used to input circuit data and setting condition data. Data tables such as the netlist 10, the timing constraints table 17 and the allowable interconnection length table 18 are inputted from the input unit 21, and stored in the auxiliary memory unit 26. Modification data are also inputted from the input unit 21. The central processing unit (CCU) 22 analyzes and implements a program, inputs/outputs data and computes the data. The output unit 23 is a display device such as a flat panel display to show a comparison result, and a file output device to outputting layout data. The main memory unit 25 stores the programs and the data. The CPU 22 executes the computation (calculation) based on these program and the data. The auxiliary memory unit 26 is a memory device such as a hard disc, and stores design data such as the program, the netlist used for the circuit block placement and the interconnection length estimation among the circuit blocks or the like, and the data tables including the timing constraints.

Commands are inputted form the input unit 21 such as a keyboard and a mouse to instruct the CPU 22 to execute the circuit block placement. The CPU 22 reads out the layout design program stored in the auxiliary memory unit 26 into the main memory unit 25 to execute the layout design program. The result of the circuit block placement, which has been executed by the layout design program, is outputted to the output unit 23 such as a display device. Layout data which is the design result is stored in the auxiliary memory unit 25 or outputted from the output unit 23 for being used in the subsequent replacement and routing processes or the like.

Figure 8:
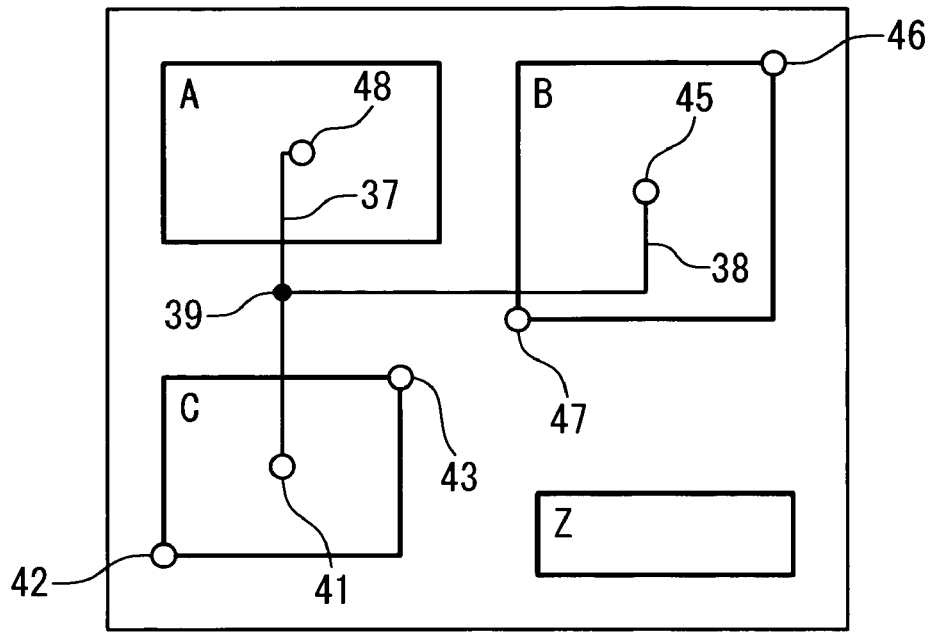
FIG. 8 is a diagram showing interconnection length estimation among circuit blocks by using Steiner tree according to the first embodiment of the present invention.

An interconnection length estimation among the circuit blocks will be explained next. The interconnection length estimation is carried out using a high-speed routing method such as a method using Steiner tree, which allows a ramification and connects a plurality of points by branches. FIG. 8 is a diagram showing the interconnection length estimation among the circuit blocks by using Steiner tree. A circuit block A, a circuit block B and the circuit block Z are placed in advance. A circuit block C is in the state of being placed near these circuit blocks into a semiconductor integrated circuit. Both the circuit block A and the circuit block B have a connection relation to the circuit block C, and the circuit block Z does not have a connection relation to the circuit block C. In the placement of the circuit block C, the interconnection length of connecting the circuit block C to the circuit blocks A and B is estimated by using Steiner tree.

Here, it is assumed that a starting point and an ending point of the routing can be selected from the center point of the each circuit block, the closest point of the each circuit block and a farthest point of the each circuit block. More precisely, in estimating the interconnection length between the circuit block B and the circuit block C, endpoints to be the starting point and the ending point of the routing are set as follows. In the circuit block C, the center point 41 in the center of the circuit block C, the farthest point 42 which is located at the farthest from the circuit block B and the closest point 43 which is located at the closest to the circuit block B are set. In the circuit block B, the center point 45, the farthest point 46 and the closest point 47 are set. Among these points, an interconnection to connect the center point 41 of the circuit block C and the center point 45 of the circuit block B is considered as a typical (average) interconnection length in estimating the interconnection length between the circuit block B and the circuit block C. An interconnection to connect the farthest point 42 of the circuit block C and the farthest point 46 of the circuit block B is considered as the worst (longest) interconnection length in estimating the interconnection length between the circuit block B and the circuit block C. An interconnection to connect the closest point 43 of the circuit block C and the closest point 47 of the circuit block B is considered as the best (shortest) interconnection length in estimating the interconnection length between the circuit block B and the circuit block C.

For ease of explanation, FIG. 8 shows a state of estimating the typical interconnection length by connecting the center points of each circuit block. An interconnection 37 to connect the circuit block A and the circuit block C starts from the center point 48 of the circuit block A and reaches to the center point 41 of the circuit block C through a Steiner point 39. The length of the interconnection 37 is considered as the typical interconnection length between the circuit block A and the circuit block C. An interconnection 38 to connect the circuit block B and the circuit block C starts from the center point 45 of the circuit block B and reaches to the center point 41 of the circuit block C through the Steiner point 39. The length of the interconnection 38 is considered as the typical interconnection length between the circuit block B and the circuit block C. The interconnection from the Steiner point 39 to the center point 41 of the circuit block C is shared. Accordingly, in selecting the typical interconnection length for the circuit block C, the interconnection 37 is considered as the interconnection length estimation with respect to the circuit block A and the interconnection 38 is considered as the interconnection length estimation with respect to the circuit block B. The method to estimate the interconnection length is not limited to the method using Steiner tree, and may be one of other well-known high-speed routing methods.

A comparison method between the timing constraints and the estimated interconnection length will be explained next. The allowable interconnection length in a certain operational frequency is calculated on the basis of the timing constraints table 17 and the allowable interconnection length table 18. Specifically, timing constraints of an interconnection, which is the object for comparison, is extracted from the timing constraints table 17. For example, referring to FIG. 7, it is shown that the operational frequency of 300 MHz is set for the interconnection between the circuit block B and the circuit block C. It is also shown that there are provided two kinds of interconnections between the circuit block A and the circuit block C. One is an interconnection 1 with the operational frequency of 300 MHz and another is an interconnection 2 with the operational frequency of 500 MHz.

When the operational frequency is extracted, an allowable interconnection length corresponding to the operational frequency is extracted referring to the allowable interconnection length table 18. Since the operational frequency of 300 MHz is set for the interconnection between the circuit block B and the circuit block C, the allowable interconnection length is considered as 12 mm referring to the allowable interconnection length table 18 as shown in FIG. 6.

The interconnection length comparison section 14 compares the obtained allowable interconnection length to the interconnection length estimated in the interconnection length estimation section 12. Specifically, in the case of the operational frequency of 300 MHz, the interconnection length exceeds the allowable interconnection length if the estimated interconnection length is beyond 12 mm. On the other hand, the interconnection length is within the allowable range if the estimated interconnection length is 12 mm or less. Each estimated interconnection is thus compared to an allowable interconnection length in a corresponding operational frequency among the circuit blocks.

When there is set a plurality of the operational frequencies for the interconnection such as the interconnection between the circuit block A and the circuit block C, the allowable interconnection length corresponding to each operational frequency is obtained. In the interconnection 1 between the circuit block A and the circuit block C, the operational frequency of 300 MHz is set and the allowable interconnection length is therefore 12 mm. In the interconnection 2 between the circuit block A and the circuit block C, the operational frequency of 500 MHz is set and the allowable interconnection length is therefore 4 mm. If it is assumed that the allowable interconnection length is 10 mm between the circuit block A and the circuit block C, the interconnection in the operational frequency of 300 MHz is within the allowable range ((allowable interconnection length: 12 mm)>(estimated interconnection length: 10 mm)) In the case of the operational frequency of 500 MHz, the interconnection exceeds the allowable range by 6 mm ((allowable interconnection length: 4 mm)<(estimated interconnection length: 10 mm) ). Here, the values shown in the timing constraints table 17 and the allowable interconnection length table 18 are examples, and are provided for the explanation purposes. The present invention is not limited in these values.

The obtained comparison result is transferred to the display section 16 for a graphical display.

Figure 5:
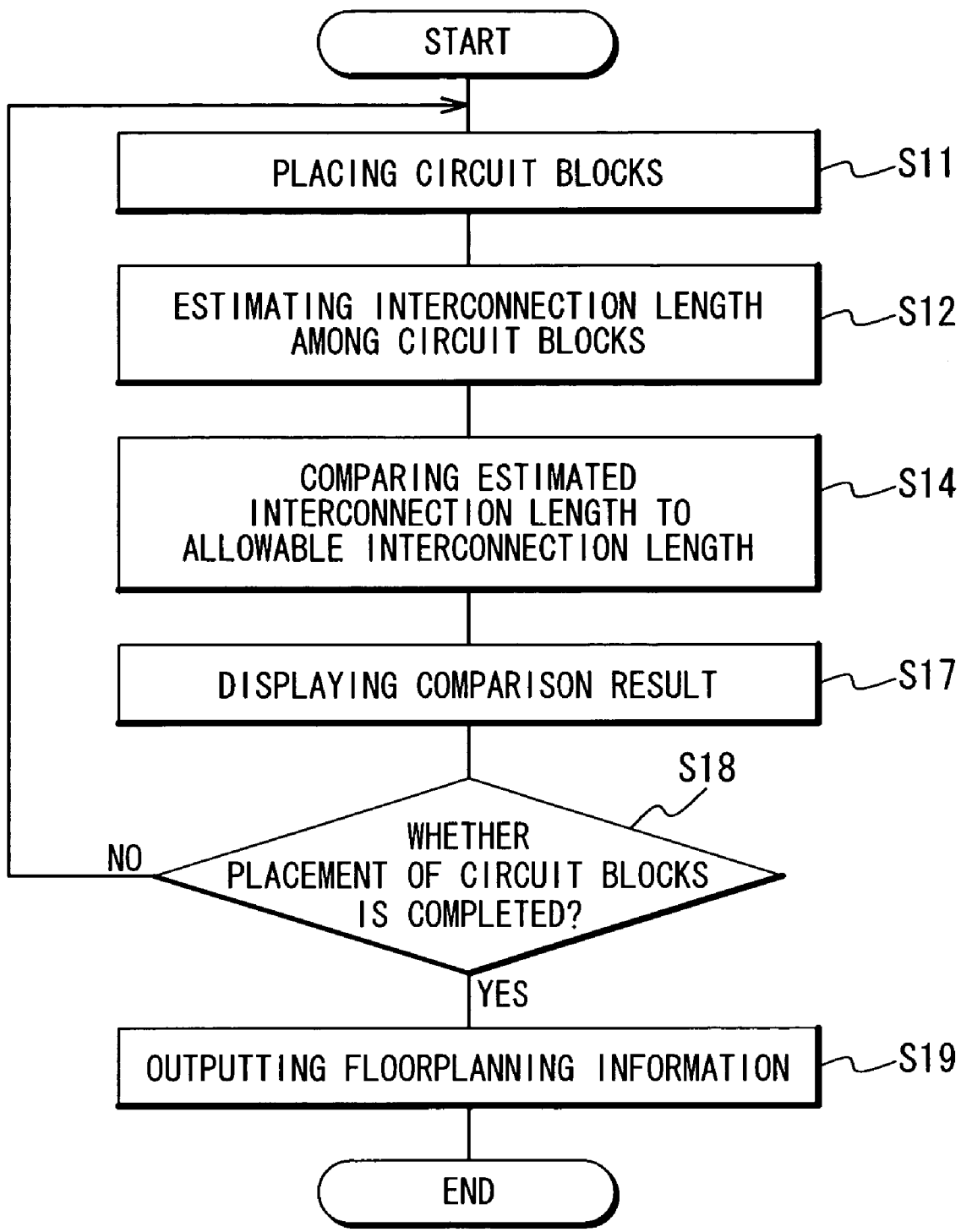
FIG. 5 is a flowchart showing an operation of the layout design device according to the first embodiment of the present invention.

Next, operations of the layout design device for the floorplanning will be explained below. FIG. 5 is a flowchart showing an operation of the layout design device for a floorplanning process according to the first embodiment. Before conducting the floorplanning process, data in the netlist 10, the timing constraints table 17 and the allowable interconnection length table 18 are supplied into the auxiliary memory unit 26 in advance.

(Step S11: Circuit Block Placement Step)

In the floorplanning process, the circuit block placement section 11 takes into account the routing congestion based on the data on the number of the connected interconnections among the circuit blocks, and places each circuit block in the same manner with the conventional floorplanning process. The circuit block placement section 11 also determines the shape of the circuit block.

(Step S12: Interconnection Length Estimation Step Among Circuit Blocks)

Next, the interconnection length estimation section 12 estimates the interconnection lengths among the placed circuit blocks. As described above, a conventional high-speed routing method is employed such as the method using Steiner tree, which allows a ramification and connects a plurality of points by branches. The starting point and the ending point of the routing can be selected from the respective center points of the circuit blocks, the respective closest points which are the closest points among the circuit blocks, and the respective farthest points which are the farthest points among the circuit blocks. The typical interconnection length, the best interconnection length and the worst interconnection length can be estimated based on these points. Once the starting point and the ending point of the routing are determined, the distance between the placed circuit blocks is calculated on the basis of the starting point and the ending point of the routing, the calculated distance is considered as the estimated interconnection length between the circuit blocks.

(Step S14: Interconnection Length Comparison Step)

The interconnection length comparison section 14 compares the estimated interconnection length, which is the estimation result, to the allowable interconnection length corresponding to the operational frequency of the interconnection. Before the comparison, the allowable interconnection length corresponding to the operational frequency indicated in the timing constraints table 17 is obtained on the basis of the timing constraints table 17 and the allowable interconnection length table 18. If there are a plurality of the timing constraints between the identical circuit blocks, the allowable interconnection length corresponding to the each operational frequency is extracted from the allowable interconnection length table 18 listing each operational frequency, and the allowable interconnection length corresponding to the each operational frequency is obtained and compared to the estimated interconnection length.

As explained above, referring to FIGS. 6 and FIG. 7, the interconnection length comparison section 14 judges the interconnection between the circuit blocks B and C as within the allowable range if the interconnection length is 12 mm or less. When the interconnection length is 10 mm between the circuit blocks A and C, the interconnection length comparison section 14 judges the interconnection 1 in the operational frequency of 300 MHz as within the allowable range. However, the interconnection length comparison section 14 judges the interconnection 2 in the operational frequency of 500 MHz as the excess of the allowable range. The interconnection length comparison section 14 outputs the judgement result to the display section 16.

(Step S17: Comparison Result Display Step)

The display section 16 receives the comparison result, in which the estimated interconnection lengths between the circuit blocks A and C, and between the circuit blocks B and C were compared to the allowable interconnection length in its operational frequency. Then, the display section 16 graphically displays the comparison result on a screen of the display device (output unit) 23 in the display section 16. On the screen, the interconnections among the circuit blocks are displayed by figures showing the placed circuit blocks and line segments connecting the figures showing the placed circuit blocks. It is shown to judge whether the target timing constraints among the circuit blocks are satisfied by the interconnections. Specifically, it shows the state whether the interconnection is satisfactory enough, practically satisfactory or unsatisfactory in terms of the timing constraints. Also, it shows an exceeded length in the case of the excess of the allowable interconnection length.

For example, line segments with different colors are employed for showing the interconnection, using blue if the timing constraints are satisfactory enough, yellow if the timing constraints are practically satisfactory and red if the timing constraints are unsatisfactory, wherein a satisfaction degree of the timing constraints among the circuit blocks can be easily judged by the visual recognition. If the timing constraints are unsatisfactory, the screen shows the comparison result in which the timing constraints were compared to the interconnection estimated value between the circuit blocks, i.e. the excessive value beyond the allowable interconnection length. If there is a plurality of the timing constraints among the identical circuit blocks, the comparison results are shown with respect to the each timing constraints.

Figure 9:
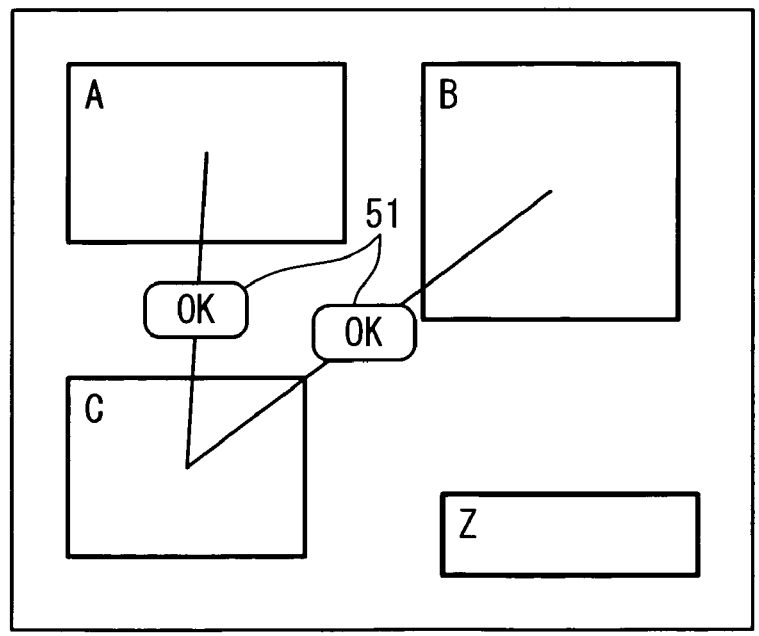
FIG. 9 is a diagram showing a display example of a comparison result between timing constraints and estimated interconnection lengths among circuit blocks according to the first embodiment of the present invention.
Figure 10:
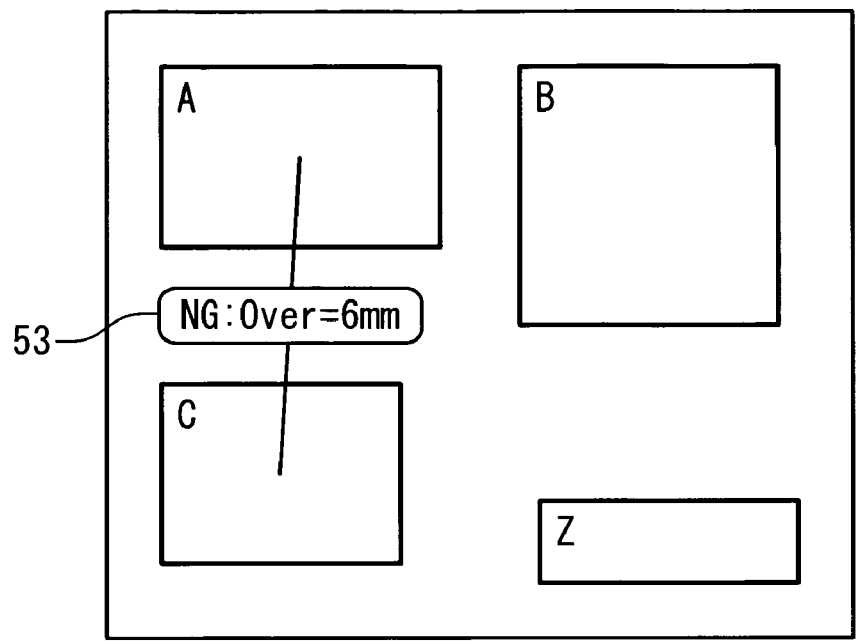
FIG. 10 is a diagram showing a display example of a comparison result between timing constraints and estimated interconnection lengths among the circuit blocks according to the first embodiment of the present invention.

FIG. 9 is an example showing the timing constrains, wherein the circuit block C is placed to the area in which the circuit block A and the circuit block B have been already placed. Here, the operational frequency is 300 MHz between the circuit blocks C and A, and between the circuit blocks C and B. In the placement position of the circuit block C, the timing constraints are satisfactory enough between the circuit blocks C and A, and between the circuit blocks C and B with respect to the operational frequency of 300 MHz, and therefore "OK" is shown by signs 51.

FIG. 8 is an example showing the interconnection 2 in the operational frequency of 500 MHz between the circuit blocks C and A. A sign 53 shows that the placement position of the circuit block C is not satisfactory by 6 mm in the timing constraints between the circuit blocks C and A with respect to the frequency of 500 MHz. Specifically, the "NG" means the excess of the allowable interconnection length and the "Over=6 mm" means the excessive value of the allowable interconnection length.

As described above, for every placement of the circuit blocks, a graphical indication is displayed on the screen to show the satisfaction degree of the timing constraints in all the circuit blocks connected to the circuit blocks to be placed. Therefore, it is possible for users (designers) to visually judge whether the position of the circuit block to be placed is satisfactory in terms of the timing constraints at a point of the placement.

(Step S18: Placement Completion Judging Step)

When the display was finished and there is still a circuit block, which has not been placed yet, the above processes are repeated by returning to the step S11 for placing the following circuit block. If the estimated value is beyond the allowable value, the placement is repeated for correction. It is completed when all the circuit blocks have been placed by the repeated placement of the circuit blocks.

(Step S19: Output Processing Step)

When the placement of all the circuit blocks has been completed, floorplanning information including the information of the circuit block placement, which has been prepared as described above, is outputted. Then, the subsequent placement and routing processes are executed.

According to the first embodiment, in the layout of a LSI with a very large scale and a high operational frequency, in addition to the conventional floorplanning in consideration with the routing congestion based on the number of the interconnections among the circuit blocks, it is possible for users (designers) to confirm in every placement of the circuit blocks whether a desired timing constraints are satisfied in the placement position of the circuit blocks. Therefore, a floorplanning to cope with both the routing congestion and the timing constraints can be optimally prepared. Turning back of floorplanning caused by the routing congestion or the violation of the timing constraints, and repetitive processing from the floorplanning to the placement and routing can be avoided.

In other words, in placing the circuit blocks, the conventional placement of the circuit blocks is implemented in consideration with the number of connected interconnections among the circuit blocks so that the routing congestion can be eliminated. In addition, the satisfaction degree of the timing constraints in the placement position of the circuit blocks is indicated for every circuit block placement, and users can confirm whether the position of the circuit block satisfies the timing constraints without carrying out the routing after the layout process in the present invention.

Accordingly, it is judged by the users whether the position of the circuit block is satisfactory in terms of the timing constraints in the floorplanning stage, and repetitive processes from consideration of the floorplanning to the placement and routing are not required in order to obtain an optimum floorplanning in which the timing constraints are satisfied. Therefore, it is possible to obtain the floorplanning capable of carrying out the placement and routing with a short TAT.

It is also indicated for every placement of the circuit blocks whether the placement position of the circuit block is satisfactory in terms of the timing constraints. Therefore, it is possible to prevent enormous simultaneous indications of all the violations of the timing constraints after all the circuit blocks have been placed, and confusions can be thus reduced.

The above processes allow a balance between the routing congestion and the timing satisfaction degree inside the chip for preparing the floorplanning, and prevent another routing congestion or violation of the timing constraints among surrounding circuit blocks or in surrounding areas.

Since the distance among the circuit blocks is in the optimum state, it is possible to simultaneously bring the convergence of both the set-up and hold timing violations.

Figure 11:
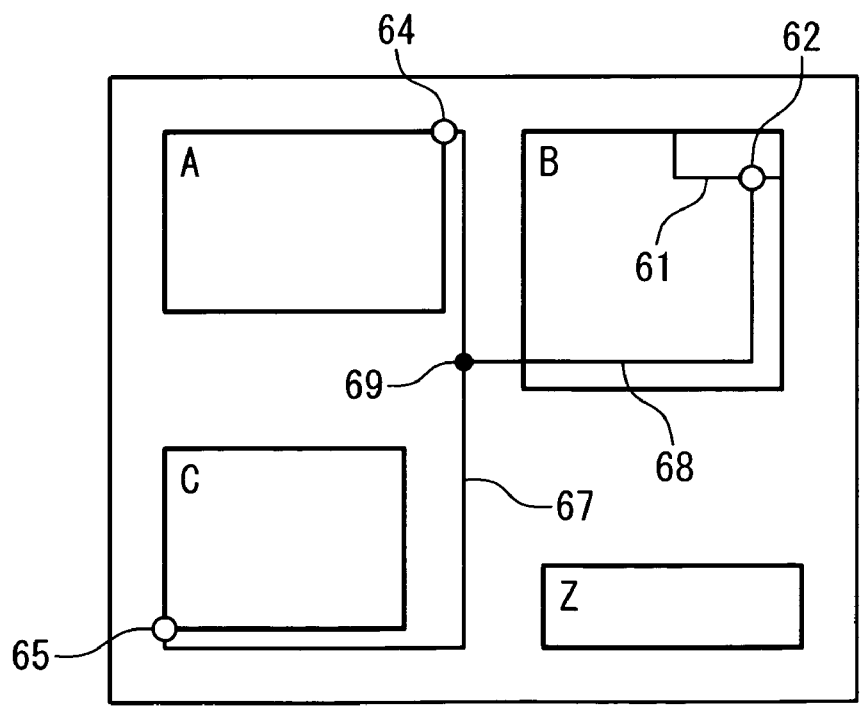
FIG. 11 is a diagram showing interconnection length estimation among circuit blocks including a placed cell by using Steiner tree according to a first modified example of the first embodiment of the present invention.

Next, a first modified example of the first embodiment, related to the interconnection length estimation among circuit blocks including a placed cell, will be explained below. FIG. 11 is a diagram showing interconnection length estimation among circuit blocks including a placed cell by using Steiner tree according to the first modified example. In FIG. 11, a circuit block A, a circuit block B and the circuit block Z are placed in advance. The circuit block B includes a placed cell 61. A circuit block C is in the state of being placed. Both the circuit block A and the circuit block C have a connection relation to the placed cell 61 in the circuit block B, and the circuit block Z has no connection relation to the circuit block C. In placing the circuit block C, the interconnection length to connect the circuit block A, the placed cell 61 in the circuit block B and the circuit block C is estimated by using Steiner tree. In the placed cell 61, a terminal position 62 is set to connect the circuit block C and the circuit block A.

If the placed cell does not exist, as explained in the first embodiment, the starting point and the ending point of the routing can be selected from the respective center points of the circuit blocks, the respective closest points between the circuit blocks and the respective farthest points between the circuit blocks. Accordingly, the interconnection length between the circuit block A and the circuit block C is thus calculated.

As shown in FIG. 11, when the placed cell 61 is included in the circuit block B, and there is an interconnection between the placed cell 61 and the circuit block C, endpoints of the routing are set as follows for estimating the interconnection length.

(1) In the case that the placed 61 is in the furthest position of the circuit block B from the circuit block C:

As shown in FIG. 11, when the placed cell 61 is in the farthest position from the circuit block C inside the circuit block B, the farthest point in the circuit block B with respect to the circuit block C is a terminal position 62 in the placed cell 61. The farthest point in the circuit block C with respect to the circuit block B is a bottom left corner position 65 of the circuit block C. Therefore, a path 68 connecting the point 62 and the point 65 is considered as the longest interconnection between the circuit block B and the circuit block C, and the path length is estimated as a worst interconnection length.

In this case, a path to connect the closest point in the circuit block C with respect to the circuit block B and an closest point in the circuit block B with respect to the circuit block C is considered as the shortest path, and the path length is estimated as the best interconnection length. A path to connect a center point of the circuit block C and a center point of the circuit block B is considered as the average interconnection, and the path length is estimated as the typical interconnection length.

(2) In the case that the placed cell 61 is in the closest position of the circuit block B to the circuit block C:

In the circuit block B, the placed cell 61 is in the closest position to the circuit block C, the terminal position 62 in the placed cell 61 is considered as the closest point. In the case of the positioning relation of the circuit blocks as shown in FIG. 11, the closest point in the circuit block C with respect to the circuit block B is an upper right corner of the circuit block C. Accordingly, the interconnection length of a path to connect the closest point in the circuit block C with respect to the circuit block B and the terminal position 62 in the placed cell 61 is considered as the best interconnection length in the estimation between the circuit block B and the circuit block C.

A path connecting the farthest point in the circuit block C with respect to the circuit block B and the farthest point in the circuit block B with respect to the circuit block C is considered as the longest interconnection, and the path length is estimated as the worst interconnection length. Moreover, a path to connect a center point of the circuit block C and a center point of the circuit block B is considered as the average interconnection, and the path length is estimated as the typical interconnection length.

(3) In the case that the placed cell 61 is in neither the closest position nor the furthest position of the circuit block B with respect to the circuit block C:

The placed cell 61 is not considered as the endpoint to estimate the interconnection length with respect to the circuit block C. Accordingly, the length of the interconnection connecting the circuit block B and the circuit block C is estimated in the same manner in which the placed cell 61 does not exist. Specifically, the length of the interconnection connecting the center point of the circuit block C and the center point of the circuit block B is considered as the typical interconnection length between the circuit block B and the circuit block C in the estimation. The length of the interconnection connecting the farthest point in the circuit block C with respect to the circuit block B and the farthest point in the circuit block B with respect to the circuit block C is estimated as the worst interconnection length between the circuit block B and the circuit block C. Moreover, the length of the interconnection connecting the closest point in the circuit block C with respect to the circuit block B and the closest point in the circuit block B with respect to the circuit block C is considered as the best interconnection length between the circuit block B and the circuit block C in the estimation.

Therefore, the interconnection between the circuit block A and the circuit block C can be selected from the respective center points of the circuit blocks, the respective closest points between the circuit blocks and the respective farthest points between the circuit blocks. In the interconnection between the circuit block B including the placed cell 61 and the circuit block C, the center points of the circuit block B and the circuit block C are selected as the endpoints of the typical interconnection length. As the endpoint of the interconnection in the best interconnection length, the terminal 62 in the placed cell 61 is selected when the placed cell 61 is in the closest position to the circuit block C, and a point in the circuit block B which is the closest to the circuit block C is selected when the placed cell 61 is not placed in the closest position to the circuit block C. As the endpoint of the interconnection in the worst interconnection length, a terminal in the placed cell 61 is selected when the placed cell 61 is placed in the farthest position from the circuit block C, and a point in the circuit block B which is the farthest to the circuit block C is selected when the placed cell 61 is not placed in the farthest position from the circuit block C.

When all the interconnections between the circuit block B and the circuit block C are connected to the placed cell 61, the endpoint of the circuit block B is preferable to be the terminal 62 in the placed cell 61, instead of the center point, the closest point and the farthest point in the circuit block B.

When the terminal 62 in the placed cell 61 is set as the starting point or the ending point in the interconnection estimation, the result of the interconnection estimation shows the path from the terminal 62 in the placed cell 61 to the terminal 65 in the circuit block C through the Steiner point 69 as indicated in the interconnection 68 in FIG. 11. In the case of the circuit block including the placed cell as described above, the terminal of the placed cell is treated as the endpoint of the interconnection length estimation, which will improve the accuracy of the interconnection length estimation.

The operation of the layout design device for the floorplanning process to place the circuit blocks including the placed cell is the same manner as the first embodiment explained with reference to FIG. 5, except that estimation method in the step S12 is replaced as described above. Accordingly, it will be explained as follows referring to FIG. 5.

(1) Data table such as the netlist 10, the timing constraints table 17 and the allowable interconnection length table 18 are entered into the auxiliary memory unit 26 by the input unit 21.

(2) The circuit block placement section 11 places circuit blocks (step S11).

(3) The interconnection length estimation section 12 then estimates the interconnection length among the circuit blocks which have been placed (step S12). The starting point and the ending point of the routing with respect to the circuit block A and the circuit block C are selected from the respective center points of the circuit blocks, the respective closest points between the circuit blocks and the respective farthest points between the circuit blocks. As shown in FIG. 11, the circuit block B includes the placed cell 61. Therefore, in the circuit block B, a terminal position in which the distance from the circuit block C is on average is selected as a typical endpoint among the terminals of the circuit block B. Among the terminals in the circuit block B, in the case that the placed cell 61 is in the closest position from the circuit block C, the terminal 62 of the placed cell 61 is considered as the best endpoint. In the case that the placed cell 61 is not in the closest position, the terminal where the distance from the circuit block C is the shortest is considered as the best endpoint. Among the terminals in the circuit block B, in the case that the placed cell 61 is in the farthest position from the circuit block C, the terminal 62 of the placed cell 61 is considered as the worst endpoint. In the case that the placed cell 61 is not in the farthest position, the terminal where the distance from the circuit block C is the longest is considered as the worst endpoint. Among these endpoints of the routing, endpoints for the interconnection estimation are selected. Accordingly, when the circuit block includes the placed cell, terminals in the placed cell are treated as the starting point or the ending point in the interconnection length estimation, which will increase the accuracy of the interconnection length estimation.

(4) The interconnection length comparison section 14 compares the allowable interconnection length to the interconnection length estimation result among the circuit blocks (step S14). The allowable interconnection length corresponds to the operational frequency identified on the basis of the allowable interconnection length in each operational frequency stored in the allowable interconnection length table 18 and the timing constraints stored in the timing constraints table 17. The interconnection length estimation result is calculated in the interconnection length estimation section 12.

(5) The display section 16 graphically displays the result received from the interconnection length comparison section 14 on the screen of the output unit 23 (step S17).

(6) If there is a circuit block which has not been placed yet (step S18: NO), the processes after the circuit block placement is repeated by returning to the step S11. If the placement of all the circuit blocks has been completed (step S18: YES), the placement process of the circuit blocks is finished.

(7) When the placement of the circuit blocks has been completed, the floorplanning information including the circuit block placement information, which has been prepared as described above, is outputted to the output unit 23. The floorplanning information is used for the subsequent placement and routing processes. The subsequent placement and routing processes may be continued while the floorplanning information is stored in the auxiliary memory unit 26.

As explained above, when the circuit block includes the placed cell, the terminal in the placed cell is treated as the starting point or the end point in the interconnection length estimation, which will increase the accuracy of the interconnection length estimation. Accordingly, the accuracy of determining (judging) the timing constraints in the floorplanning stage will be further increased.

Figure 12:
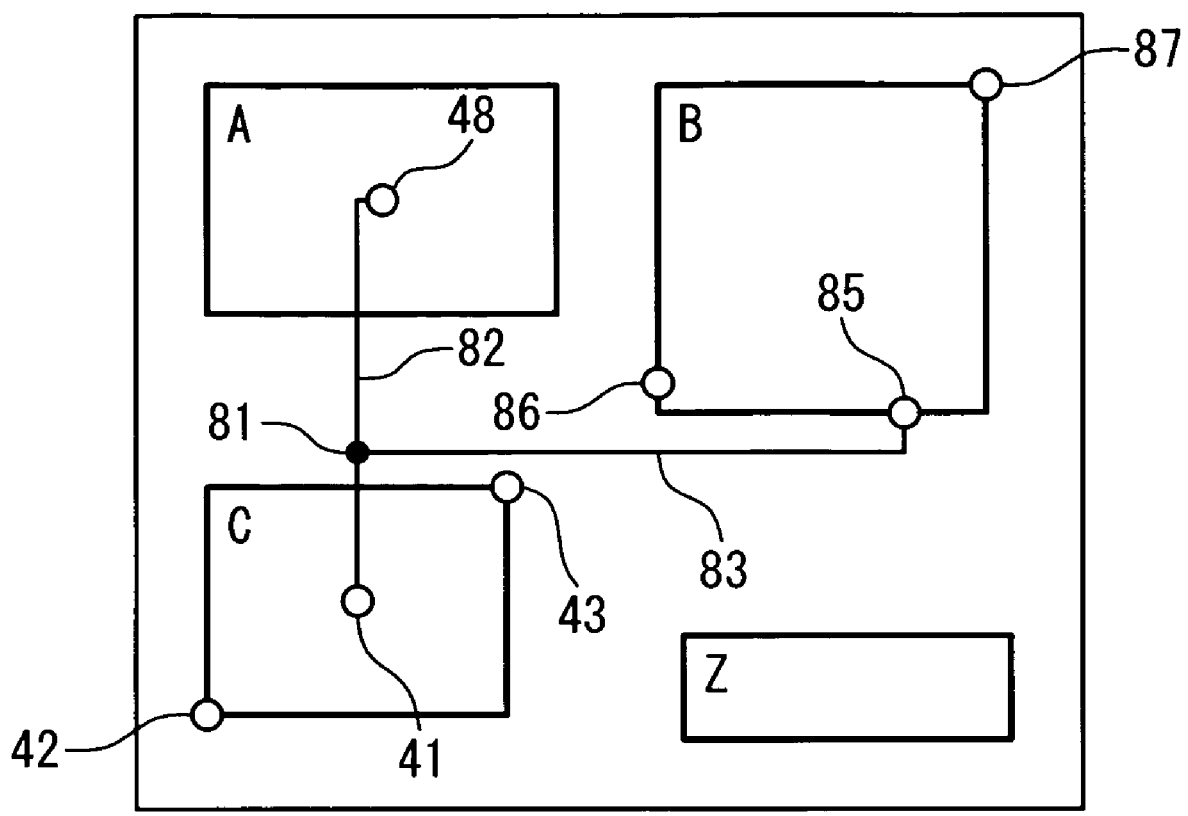
FIG. 12 is a diagram showing interconnection length estimation among layer circuit blocks by using Steiner tree according to a second modified example of the first embodiment of the present invention.

Next, a second modified example of the first embodiment, related to the interconnection length estimation among circuit blocks including a layer block, will be explained below. FIG. 12 is a diagram showing interconnection length estimation among layer circuit blocks by using Steiner tree according to a second modified example. Along with the accelerated tendency toward the large-scale semiconductor integrated circuit, the design TAT will be enormously increased in the general flat layout method to simultaneously layout the overall circuits in the layout design. Therefore, when the layout design is carried out by using the gate-array method and the standard-cell method, a layer layout method is often employed. In the layer layout method, a logic layer is divided into a plurality of layer blocks, each of the plurality of layer blocks is placed, and then, routing among these layer blocks is carried out in a top layer.

A circuit block A, the circuit block B and the circuit block Z are placed in advance. The circuit block B is a layer block. The circuit block B has a terminal to be connected to other circuit blocks. Specifically, a terminal position is set in the circuit block B for being connected to other circuit blocks. The circuit block C is to be placed here. The circuit block C is connected to the circuit block A and the circuit block B, and not connected to the circuit block Z.

In the connection between the circuit block B and the circuit block C, the following three points are set as the endpoints in the circuit block B. Specifically, the endpoints set in the circuit block B include an average (typical) endpoint 85, an shortest (best) endpoint 86 and an longest (worst) endpoint 87. From the average (typical) endpoint 85, the distance to the circuit block C is in the average. From the shortest (best) endpoint 86, the distance to the circuit block C is in the shortest. From the longest (worst) endpoint 87, the distance to the circuit block C is in the longest. Since a terminal position is not set as an endpoint in the circuit block C, the following endpoints are assumed. One is an average (typical) endpoint 41, which is the center of the circuit block C. Another one is a shortest (best) endpoint 43, from which the distance to the circuit block B is the shortest. Still another one is a longest (worst) endpoint 42, from which the distance to the circuit block B is the longest. The respective typical endpoints, the best endpoints and the worst endpoints in the circuit block B and the circuit block C are selected as the endpoints corresponding to each other.

Connection between the circuit block A and the circuit block C can be, as explained above, selected form the endpoints including the respective center points of the circuit blocks, the respective closest points between the circuit blocks and the respective farthest points between the circuit blocks.

When a terminal in the circuit block B is determined as the starting point or the ending point, a path 82 and a path 83 are estimated in the result of the typical interconnection length estimation as shown in FIG. 12. The typical interconnection length between the circuit block A and the circuit block C is an interconnection length of the path 82 from an endpoint 48 to an endpoint 41 through a Steiner point 81. The typical interconnection length between the circuit block B (layer block) and the circuit block C is an interconnection length of the path 83 from an endpoint 85 to the endpoint 41 through the Steiner point 81. Therefore, in the case of a circuit block being a layer block, a terminal in the layer block is treated as the starting point or the ending point of the interconnection length estimation, which will increase the accuracy of the interconnection length estimation.

The operation of the layout design device for the floorplanning process to place the layer blocks is the same manner as the first embodiment explained with reference to FIG. 5, except that estimation method in the step S12 is replaced as described above. Accordingly, it will be explained as follows referring to FIG. 5.

(1) Data table such as the netlist 10, the timing constraints table 17 and the allowable interconnection length table 18 are supplied into the auxiliary memory unit 26 by the input unit 21.

(2) The circuit block placement section 11 places circuit blocks (step S11).

(3) The interconnection length estimation section 12 then estimates the interconnection length among the circuit blocks which have been placed (step S12). The starting point and the ending point of the routing with respect to the circuit block A and the circuit block C are selected from the respective center points of the circuit blocks, the respective closest points between the circuit blocks and the respective farthest points between the circuit blocks. As shown in FIG. 12, the circuit block B is a layer block in which positions of terminals connected to other circuit blocks are set. Therefore, in the circuit block B, a terminal position in which the distance from the circuit block C is on average is selected as an average (typical) endpoint among the terminals of the circuit block B. Among the terminals in the circuit block B, terminal positions in which the distance from the circuit block C is the shortest and the longest are respectively selected as the shortest (best) endpoint and the longest (worst) endpoint. Among these endpoints of the routing, endpoints for the interconnection estimation are selected. Accordingly, when the circuit block is the layer block, terminals in the layer block are treated as the starting point or the ending point in the interconnection length estimation, which will increase the accuracy of the interconnection length estimation.

(4) The interconnection length comparison section 14 compares the allowable interconnection length to the interconnection length estimation result among the circuit blocks (step S14). Here, the allowable interconnection length corresponds to the operational frequency identified on the basis of the allowable interconnection length in each operational frequency stored in the allowable interconnection length table 18 and the timing constraints stored in the timing constraints table 17. The interconnection length estimation result among the circuit blocks is calculated in the interconnection length estimation section 12.

(5) The display section 16 graphically displays the result compared in the interconnection length comparison section 14 on the screen of the output unit 23 (step S17).

(6) If there is a circuit block which has not been placed yet (step S18: NO), the processes after the circuit block placement is repeated by returning to the step S11. If the placement of all the circuit blocks has been completed (step S18: YES), the placement process of the circuit blocks is finished.

(7) When the placement of the circuit blocks has been completed, the floorplanning information including the circuit block placement information is outputted to the output unit 23. The floorplanning information is used for the subsequent placement and routing processes. The subsequent placement and routing processes may be continued while the floorplanning information is stored in the auxiliary memory unit 26.

As explained above, when the circuit block is the layer block, the terminal in the layer block is treated as the starting point or the end point in the interconnection length estimation, which will increase the accuracy of the interconnection length estimation. Accordingly, the accuracy of determining the timing constraints in the floorplanning stage will be further increased.

Second Embodiment

Figure 13:
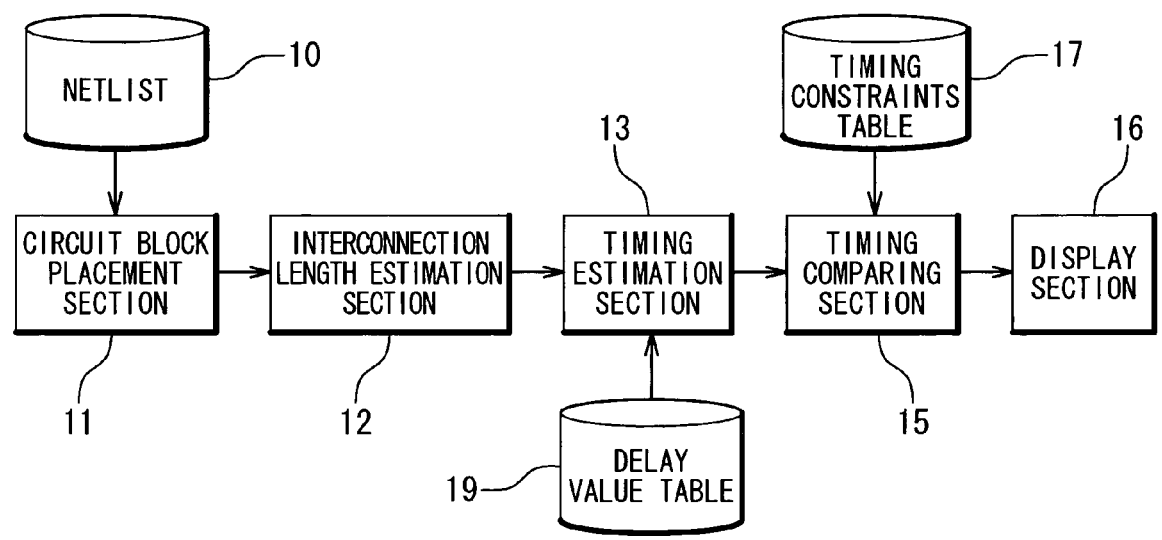
FIG. 13 is a diagram showing a configuration of a layout design device according to the second embodiment of the present invention.

Next, a layout design device according to the second embodiment of the present invention will be described below. FIG. 13 is a diagram showing a configuration of a layout design device for designing a semiconductor integrated circuit according to the first embodiment of the present invention. The layout design device includes a circuit block placement section 11, an interconnection length estimation section 12, a timing estimation section 13, a timing comparing section 15 and a display section 16. The layout design device also includes data used for processing thereof having the netlist 10, a timing constraints table 17 and a delay value table 19. Specifically, in the layout design, when the netlist 10, the timing constraints table 17 and the delay value table 19 are supplied or set, processes is carried out in the circuit block placement section 11, the interconnection length estimation section 12, the timing estimation section 13, the timing comparing section 15 and the display section 16.

The circuit block placement section 11 places circuit blocks in consideration with a routing congestion on the basis of data indicated in the netlist 10. The data indicating the placement of circuit blocks is outputted to the interconnection length estimation section 12. The interconnection length estimation section 12 calculates a distance among the circuit blocks placed in the circuit block placement section 11, which is considered as the estimated interconnection length among the circuit blocks. The calculated estimated interconnection length is outputted to the timing estimation section 13.

The timing estimation section 13 conducts a search in the delay value table 19 on the basis of a predetermined condition, and extracts a delay value per a unit interconnection length. The interconnection length estimated in the interconnection length estimation section 12 is multiplied by the delay value per the unit interconnection length in order to calculate timing among the circuit blocks. The calculated timing (delay value) among the circuit blocks is outputted to the timing comparison section 15. The timing comparison section 15 calculates a allowable delay value of the interconnection among the circuit blocks using a constraints of the interconnection among the circuit blocks indicated in the timing constraints table 17. The timing comparison section 15 compares the allowable delay value to the timing (delay value) among the circuit blocks calculated in the timing estimation section 13, and outputs the comparison result to the display section 16. The display section 16 displays the result compared in the timing comparison section 15 on a display device.

The netlist 10 is data indicating connection relations, sizes and fixed numbers of circuits, which are well-know to those who are skilled in the art. Specifically, the netlist 10 shows a configuration of the semiconductor integrated circuit and the objects of the layout. The timing constraints table 17 includes data of the operational frequency in the semiconductor integrated circuit, which indicate the timing to be satisfied by the interconnection among the circuit blocks. The timing constraints table 17 lists up the constraints 35 corresponding to the interconnection 34 among the circuit blocks as shown in FIG. 7. Here, the operational frequency is shown as the constraints. An allowable delay value is calculated from this operational frequency.

As shown in FIG. 15, the delay value table 19 stores the delay value per the unit interconnection length (delay time 75) corresponding to a setting condition 70 related to the circuit operation. In the setting condition 70 related to the circuit operation, primary factors causing the delay value variation are set such as a manufacturing process 71, a temperature 72 and a voltage 73 in the semiconductor integrated circuit. The delay values in the respective conditions are stored in the delay value table 19: for example, 0.0003 ns (nano second) delay generated per 1 µm. If the interconnection length among the circuit blocks estimated in the interconnection length estimation section 12 is 20,000 µm, the delay value among the circuit blocks can be obtained by an equation of 20000×0.0003. Therefore, the delay value among these circuit blocks, i.e. the timing is 6 ns. Here, "x" is used for a multiplication sign.

Figure 14:
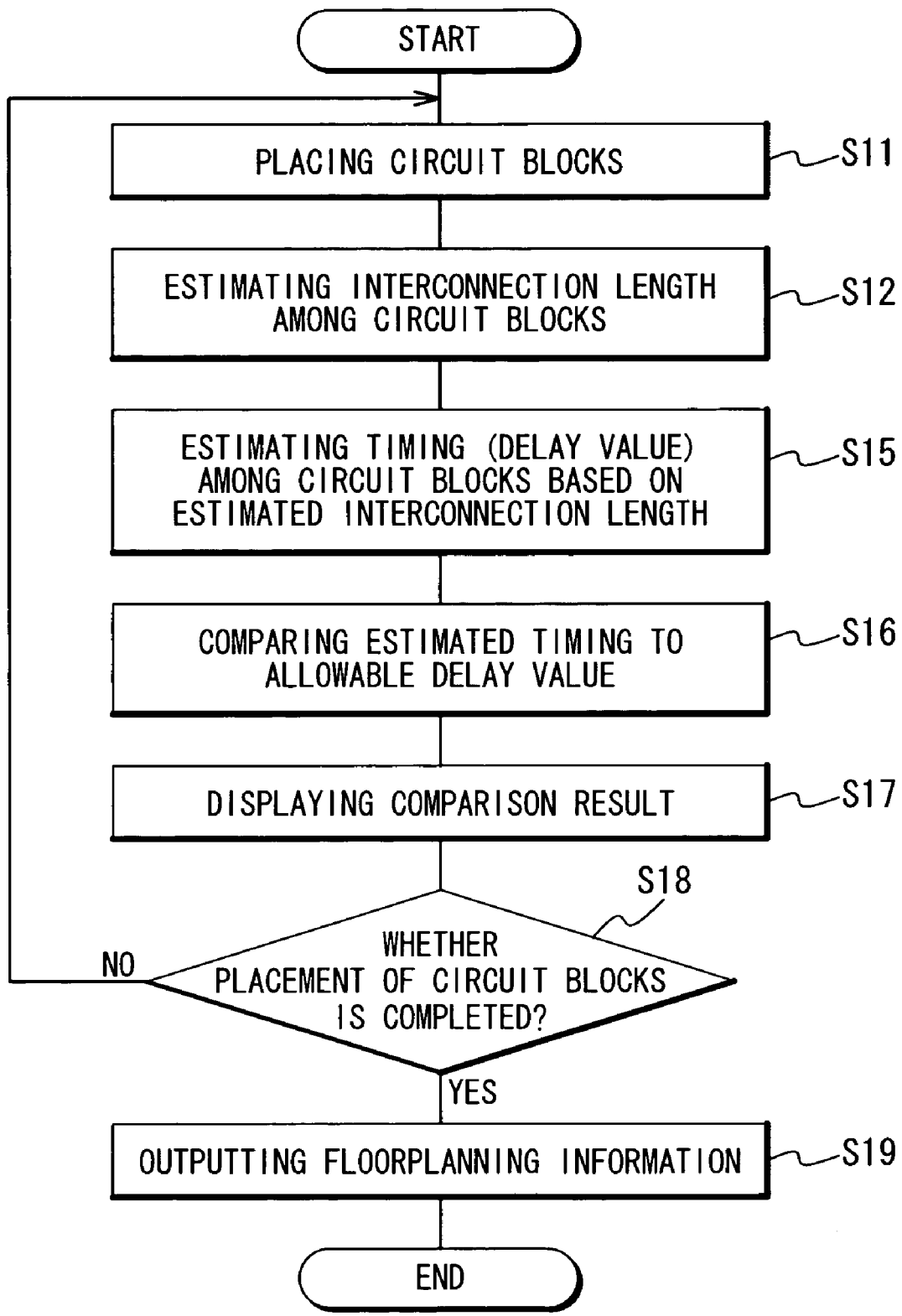
FIG. 14 is a flowchart showing an operation of the layout design device according to the second embodiment of the present invention.

Next, operations of the layout design device for the floorplanning will be explained below. FIG. 14 is a flowchart showing an operation of the layout design device for a floorplanning process according to the second embodiment. Before conducting the floorplanning process, data in the netlist 10, the timing constraints table 17 and the delay value table 19 are supplied into the auxiliary memory unit 26 in advance. Compared to the first embodiment, the delay value table 19 is used by replacing the allowable interconnection length table 18, and the comparison using the estimated interconnection length is replaced by the comparison using the interconnection delay value. In FIG. 14, the same symbols are used for the equivalent processes explained in FIG. 5 in the first embodiment.

(Step S11: Circuit Block Placement Step)

In the floorplanning process, the circuit block placement section 11 places each circuit block in consideration with the routing congestion based on the data on the connection number among the circuit blocks in the same manner with the general floorplanning process. The shape of the circuit block is also determined.

(Step 12: Estimation Step of Interconnection Length Among Circuit Blocks)

Next, the interconnection length estimation section 12 estimates the interconnection length among the circuit blocks which have been placed. As described above, the conventional high-speed routing method is employed for the interconnection length estimation. The conventional high-speed routing method is exemplified by the method using Steiner tree, which allows a ramification and connects a plurality of points by branches. The starting point and the ending point of the routing can be selected from the respective average endpoints of the circuit blocks, the respective shortest endpoints among the circuit blocks and the respective longest endpoints among the circuit blocks. Therefore, the interconnection length in the average (typical), the shortest (best) and the longest (worst) can be estimated. Once the starting point and the ending point of the routing are determined, the distance among the circuit blocks which have been place is calculated on the basis of the starting point and the ending point of the routing, which is considered as the estimated interconnection length among the circuit blocks.

(Step S15: Timing Estimation Step)

The timing estimation section 13 estimates the timing among the circuit blocks wherein the estimated interconnection length among the circuit blocks is multiplied by the delay value per the unit interconnection length extracted in the delay value table 19. For example, if the estimation result of the interconnection length among the circuit blocks is 20,000 μm and the delay value per the unit interconnection length is 0.0003 ns per 1 μm, the delay value among the circuit blocks can be obtained by an equation of 20,000×0.0003. Therefore, the delay value among the circuit blocks, i.e. the timing is 6 ns.

(Step S16: Timing Comparison Step)

In the timing comparison section 15, the timing estimation result, which is the calculated delay value among the circuit blocks, is compared to the allowable delay value obtained from the operational frequency indicated in the timing constraints table 17. For example, if the timing constraints are 100 MHz, the target (allowable) delay value will be 10 ns. If the estimated delay value among the circuit blocks is 6 ns, there will be a margin of 4 ns (=10 ns−6 ns) with respect to the target delay value of 10 ns. Accordingly, the timing constraints are satisfied in the comparison result. If the timing constraints are 500 MHz, the target (allowable) delay value will be 2 ns, and there will be a timing violation of 4 ns (=2 ns−6 ns) with respect to the target delay value of 2 ns. Accordingly, the timing constraints are not satisfied in the comparison result.

(Step S17: Comparison Result Indication Step)

In the display section 16, the comparison result between the estimation delay value and the target delay value is graphically displayed on the screen. If the timing constraints are not satisfied, an excessive delay value calculated in the timing comparison section 15 with respect to the target delay value is displayed as additional information.

(Step S18: Placement Completion Determination Step)

When the display is finished and there is still a circuit block which has not been placed yet, the above processes are continued by returning to the step S11 and placing the subsequent circuit blocks. If the estimation value is beyond the allowable value, the placement is carried out again for correction. Continuation of placing the circuit block will last until the completion of placing all the circuit blocks.

(Step S19: Output Process Step)

When the placement of the entire circuit block is completed, the floorplanning information including the circuit block placement information is used for the subsequent placement and routing processes.

According to the second embodiment as described above, the delay value per the unit interconnection length is considered as the input data, which enables the preparation of the optimum floorplanning to cope with both the routing congestion and the timing constraints. Therefore, elimination of the routing congestion, the retrogressive floorplanning caused by the violation of the timing constraints and the repetitive placement and routing from the floorplanning can be achieved.

Although the examples shown above are the comparison example of the interconnection lengths and the comparison example of the delay values, a combination thereof is possible. If there are interconnection length constraints in one interconnection and delay timing constraints in another interconnection, optimization is planed in accordance with these characteristics.

The present invention relates to a field of a design method in the semiconductor integrated circuit, which is a design method to obtain a floorplanning wherein a routing congestion is considered and a timing condition is satisfied in terms of a layout of a large-scale LSI with a high-operational frequency. According to the present invention, it is possible to solve problems of the repetitive process from the floorplanning consideration to the placement and routing process and the enormous design TAT to be required, which has been the subject of the conventional techniques. Specifically, these problems can be solved by, in addition to take into account the routing congestion degree using the information on the connecting number among the circuit blocks in placing the circuit blocks, calculating the interconnection length and/or the delay value in the position in which the circuit block was placed, and graphically displaying whether the timing required among the circuit blocks is satisfactory or not on the screen.

It is apparent that the present invention is not limited to the above embodiment that may be modified and changed without departing from the scope and spirit of the invention.

What is claimed is:

1. A computer program product for floorplanning design of a semiconductor integrated circuit, embodied on a computer-readable medium and comprising code that, when executed, causes a computer to perform the following:

(a) placing a plurality of circuit blocks based on a netlist;

(b) estimating an interconnection length between two of said placed plurality of circuit blocks based on said netlist and positions of said placed plurality of circuit blocks;

(c) judging whether or not said estimated interconnection length satisfies timing constraints for connections among said plurality of circuit blocks, based on relation data indicating relations among interconnection lengths and timings; and (d) outputting said judgment result, wherein:

said step (a) includes a step (a1) determining a placement position of a first circuit block of said plurality of circuit blocks based on numbers of connected interconnections among said plurality of circuit blocks, said first circuit block is not placed yet, said step (b) includes a step (b1) estimating said interconnection length based on a first coordinate of a first terminal and a second coordinate of a second terminal, said first terminal represents terminals of said first circuit block, to be connected to a second circuit block, said second circuit block is one of said plurality of circuit blocks, has the connection relation to said first circuit block and is already placed, said second terminal represents terminals of said second circuit block, to be connected to said first circuit block, candidates of said first terminal are a first center point indicating a geometric center of said first circuit block, a first closest point indicating the closest point of said first circuit block to said second circuit block, and a first farthest point indicating the farthest point of said first circuit block to said second circuit block, candidates of said second terminal are a second center point indicating a geometric center of said second circuit block, a second closest point indicating the closest point of said second circuit block to said first circuit block, and a second farthest point indicating the farthest point of said second circuit block to said first circuit block, and said step (b1) includes a step (b11) selecting one of a first interconnection length, a second interconnection length and a third interconnection length as said interconnection length, wherein said first interconnection length is a length of an interconnection connecting said first center point and said second center point, said second interconnection length is a length of an interconnection connecting said first closest point and said second closest point, and said third interconnection length is a length of an interconnection connecting said first farthest point and said second farthest point.

2. The computer program product according to claim 1, wherein said steps (b) to (d) are executed every time when one circuit block is additionally placed.

3. The computer program product according to claim 1, wherein:

said relation data indicates relations among allowable interconnection lengths and operational frequencies, said step (c) includes (c1) judging whether or not said estimated interconnection length satisfies an allowable interconnection length based on relation data, and said allowable interconnection length corresponds to an operational frequency which is specified by said timing constraints.

4. The computer program product according to claim 1, wherein:

said relation data includes a delay time per unit interconnection length, and said step (c) includes:

(c2) calculating a delay time based on said estimated interconnection length and said delay time per unit interconnection length, and (c3) judging whether or not said calculated delay time satisfies said timing constraints.

5. The computer program product according to claim 1, wherein said step (d) includes:

(d1) displaying said judgment result superimposed onto said placed plurality of circuit blocks in a display device.

6. The computer program product according to claim 1, wherein:

at least one of said first circuit block and said second circuit block includes a placed cell, and said step (b) further includes (b2) estimating said interconnection length based on a terminal of said placed cell as corresponding at least one of said first terminal and said second terminal.

7. The computer program product according to claim 1, wherein:

at least one of said first circuit block and said second circuit block is a layer block, of which a position of a terminal to be connected to anther circuit block is set, and said step (b) includes (b3) estimating said interconnection length based on said terminal to be connected to said another circuit block as corresponding at least one of said first terminal and said second terminal.

8. The computer program product according to claim 1, wherein said timing constraints includes operational frequencies, each of which is set correspondingly to each interconnection.

9. A layout design device for floorplanning design of a semiconductor integrated circuit, comprising:

a storing section configured to store a netlist, timing constraints for connections among a plurality of circuit blocks, and relation data indicating relations among interconnection lengths and timings;

a circuit block placing section configured to place a plurality of circuit blocks based on said netlist;

an interconnection length estimating section configured to estimate an interconnection length between two of said placed plurality of circuit blocks based on said netlist and positions of said placed plurality of circuit blocks;

a judging section configured to judge whether or not said estimated interconnection length satisfies said timing constraints based on said relation data; and a displaying section configured to output said judgment result, wherein:

said circuit block placing section determines a placement position of a first circuit block of said plurality of circuit blocks based on numbers of connected interconnections among said plurality of circuit blocks, said first circuit block is not placed yet, said interconnection length estimating section estimates said interconnection length based on a first coordinate of a first terminal and a second coordinate of a second terminal, said first terminal represents terminals of said first circuit block, to be connected to a second circuit block, said second circuit block is one of said plurality of circuit blocks, has the connection relation to said first circuit block and is already placed, said second terminal represents terminals of said second circuit block, to be connected to said first circuit block, candidates of said first terminal are a first center point indicating a geometric center of said first circuit block, a first closest point indicating the closest point of said first circuit block to said second circuit block, and a first farthest point indicating the farthest point of said first circuit block to said second circuit block, candidates of said second terminal are a second center point indicating a geometric center of said second circuit block, a second closest point indicating the closest point of said second circuit block to said first circuit block, and a second farthest point indicating the farthest point of said second circuit block to said first circuit block, and said interconnection length estimating section selects one of a first interconnection length, a second interconnection length and a third interconnection length as said interconnection length, wherein said first interconnection length is a length of an interconnection connecting said first center point and said second center point, said second interconnection length is a length of an interconnection connecting said first closest point and said second closest point, and said third interconnection length is a length of an interconnection connecting said first farthest point and said second farthest point.

10. The layout design device according to claim 9, wherein every time when one circuit block is additionally placed by said circuit block placing section, said interconnection length estimating section estimates said interconnection length, said judging section judges whether or not said estimated interconnection length satisfies said timing constraints and said displaying section outputs said judgment result.

11. The layout design device according to claim 9, wherein:
    said relation data indicates relations among allowable interconnection lengths and operational frequencies,
    said judging section judges whether or not said estimated interconnection length satisfies an allowable interconnection length based on relation data, and
    said allowable interconnection length corresponds to an operational frequency which is specified by said timing constraints.

12. The layout design device according to claim 9, wherein:
    said relation data includes a delay time per unit interconnection length, and
    said judging section calculates a delay time based on said estimated interconnection length and said delay time per unit interconnection length, and judges whether or not said calculated delay time satisfies said timing constraints.

13. The layout design device according to claim 9, wherein said displaying section displays said judgment result superimposed onto said placed plurality of circuit blocks in a display device.

14. The layout design device according to claim 9, wherein:
    at least one of said first circuit block and said second circuit block includes a placed cell, and
    said interconnection length estimating section estimates said interconnection length based on a terminal of said placed cell as corresponding at least one of said first terminal and said second terminal.

15. The layout design device according to claim 9, wherein:
    at least one of said first circuit block and said second circuit block is a layer block, of which a position of a terminal to be connected to anther circuit block is set, and
    said interconnection length estimating section estimates said interconnection length based on said terminal to be connected to said another circuit block as corresponding at least one of said first terminal and said second terminal.

16. The layout design device according to claim 9, wherein said timing constraints includes operational frequencies, each of which is set correspondingly to each interconnection.

17. A layout design method for a semiconductor integrated circuit for floorplanning design, comprising:
    (a) placing a plurality of circuit blocks based on a netlist;
    (b) estimating an interconnection length between two of said placed plurality of circuit blocks based on said netlist and positions of said placed plurality of circuit blocks;
    (c) judging whether or not said estimated interconnection length satisfies timing constraints for connections among said plurality of circuit blocks, based on relation data indicating relations among interconnection lengths and timings; and
    (d) outputting said judgment result,
    wherein:
    said step (a) includes a step (a1) determining a placement position of a first circuit block of said plurality of circuit blocks based on numbers of connected interconnections among said plurality of circuit blocks, said first circuit block is not placed yet,
    said step (b) includes a step (b1) estimating said interconnection length based on a first coordinate of a first terminal and a second coordinate of a second terminal,
    said first terminal represents terminals of said first circuit block, to be connected to a second circuit block,
    said second circuit block is one of said plurality of circuit blocks, has the connection relation to said first circuit block and is already placed,
    said second terminal represents terminals of said second circuit block, to be connected to said first circuit block,
    candidates of said first terminal are a first center point indicating a geometric center of said first circuit block, a first closest point indicating the closest point of said first circuit block to said second circuit block, and a first farthest point indicating the farthest point of said first circuit block to said second circuit block,
    candidates of said second terminal are a second center point indicating a geometric center of said second circuit block, a second closest point indicating the closest point of said second circuit block to said first circuit block, and a second farthest point indicating the farthest point of said second circuit block to said first circuit block, and
    said step (b1) includes a step (b11) selecting one of a first interconnection length, a second interconnection length and a third interconnection length as said interconnection length, wherein said first interconnection length is a length of an interconnection connecting said first center point and said second center point, said second interconnection length is a length of an interconnection connecting said first closest point and said second closest point, and said third interconnection length is a length of an interconnection connecting said first farthest point and said second farthest point.

18. The layout design method according to claim 17, wherein said steps (b) to (d) are executed every time when one circuit block is additionally placed.

19. The layout design method according to claim 17, wherein:
said relation data indicates relations among allowable interconnection lengths and operational frequencies,
said step (c) includes (c1) judging whether or not said estimated interconnection length satisfies an allowable interconnection length based on relation data, and
said allowable interconnection length corresponds to an operational frequency which is specified by said timing constraints.

20. The layout design method according to claim 17, wherein:
said relation data includes a delay time per unit interconnection length, and
said step (c) includes:
(c2) calculating a delay time based on said estimated interconnection length and said delay time per unit interconnection length, and
(c3) judging whether or not said calculated delay time satisfies said timing constraints.

21. The layout design method according to claim 17, wherein said step (d) includes:
(d1) displaying said judgment result superimposed onto said placed plurality of circuit blocks in a display device.

* * * * *